US012699264B2

(12) United States Patent
Han et al.

(10) Patent No.: US 12,699,264 B2
(45) Date of Patent: Aug. 4, 2026

(54) PHOTOSENSITIVE SYSTEM, DISPLAY APPARATUS AND METHOD FOR DETERMINING POSITION OF HUMAN EYE

(71) Applicants: Beijing BOE Display Technology Co., Ltd., Beijing (CN); BOE TECHNOLOGY GROUP CO., LTD., Beijing (CN)

(72) Inventors: Wenchao Han, Beijing (CN); Xue Dong, Beijing (CN); Wei Sun, Beijing (CN); Zhongyuan Wu, Beijing (CN)

(73) Assignees: Beijing BOE Display Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 141 days.

(21) Appl. No.: 18/696,240

(22) PCT Filed: Dec. 2, 2022

(86) PCT No.: PCT/CN2022/136326
§ 371 (c)(1),
(2) Date: Mar. 27, 2024

(87) PCT Pub. No.: WO2024/113371
PCT Pub. Date: Jun. 6, 2024

(65) Prior Publication Data
US 2025/0044585 A1 Feb. 6, 2025

(51) Int. Cl.
G02B 27/00 (2006.01)
H03F 3/45 (2006.01)
H04N 13/383 (2018.01)

(52) U.S. Cl.
CPC ..... G02B 27/0093 (2013.01); H03F 3/45179 (2013.01); H04N 13/383 (2018.05);
(Continued)

(58) Field of Classification Search
CPC ............. H03K 17/6877; H03K 5/1534; H03K 17/04123; H03K 17/567
See application file for complete search history.

(56) References Cited

U.S. PATENT DOCUMENTS

| | | | | | |
|---|---|---|---|---|---|
| 2013/0114043 | A1* | 5/2013 | Balan | ................... | H04N 13/344 |
| | | | | | 351/210 |
| 2013/0300653 | A1* | 11/2013 | Lewis | .................... | G06V 40/19 |
| | | | | | 345/156 |

(Continued)

FOREIGN PATENT DOCUMENTS

| | | |
|---|---|---|
| CN | 102413608 A | 4/2012 |
| CN | 207369179 U | 5/2018 |

(Continued)

*Primary Examiner* — Neil R Mikeska

(74) *Attorney, Agent, or Firm* — HOUTTEMAN LAW LLC

(57) ABSTRACT

A photosensitive system, a display apparatus and a method for determining a position of a human eye, the photosensitive system comprises: photosensitive array devices arranged in an array, an amplification circuit, an analog-to-digital conversion circuit and a coordinate determining circuit. The photosensitive array device comprises a plurality of photosensitive triodes, each photosensitive triode converts an optical signal of an acquired image of the human eye into current signals, the amplification circuit performs a differential amplification on the current signals to obtain a plurality of voltage difference signals, the amplification circuit is a single-sampling amplification circuit or a dual-sampling amplification circuit, the analog-to-digital conversion circuit converts the voltage difference signals into digital signals, the coordinate determining circuit determines a digital signal with the minimum value from the digital signals, and determine the position of the human eye position according to the digital signal with the minimum value.

20 Claims, 9 Drawing Sheets

(52) U.S. Cl.
CPC .... *H03F 2200/156* (2013.01); *H03F 2200/42* (2013.01); *H03F 2200/421* (2013.01)

(56) References Cited

U.S. PATENT DOCUMENTS

| | | | | |
|---|---|---|---|---|
| 2013/0342571 A1* | 12/2013 | Kinnebrew | ............. | G06F 3/147 |
| | | | | 345/633 |
| 2014/0118225 A1* | 5/2014 | Jerauld | ................... | A61B 5/11 |
| | | | | 345/8 |
| 2016/0292850 A1* | 10/2016 | Perez | ................... | G06F 3/0304 |
| 2017/0366181 A1* | 12/2017 | Wyland | ............. | H03K 17/6877 |

FOREIGN PATENT DOCUMENTS

| | | | |
|---|---|---|---|
| CN | 108733203 | A | 11/2018 |
| CN | 111510651 | A | 8/2020 |
| CN | 112558751 | A | 3/2021 |
| CN | 113703572 | A | 11/2021 |
| CN | 113805334 | A | 12/2021 |
| CN | 114136209 | A | 3/2022 |
| CN | 114374805 | A | 4/2022 |
| JP | H05244411 | A | 9/1993 |
| WO | WO2022006862 | A1 | 1/2022 |

* cited by examiner timing sequence 1 timing sequence 2 timing sequence 3 timing sequence 4 timing sequence 5 timing sequence 6 timing sequence 7 timing sequence 8 timing sequence 9 second input module 221 second driving module 222 second differential comparison module 223 second output module 224

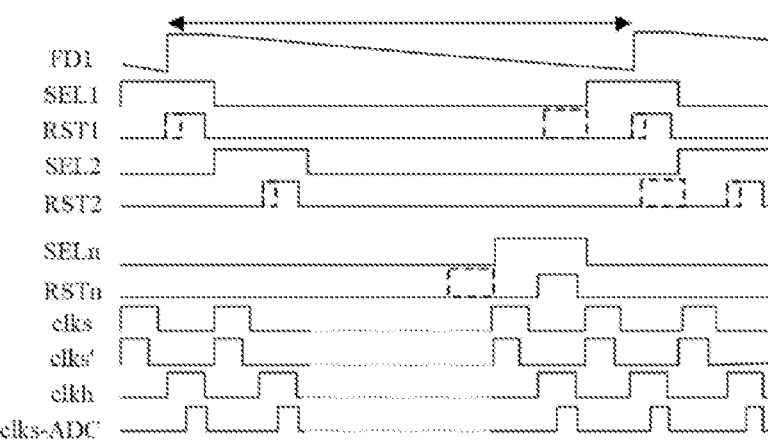

Fig. 16

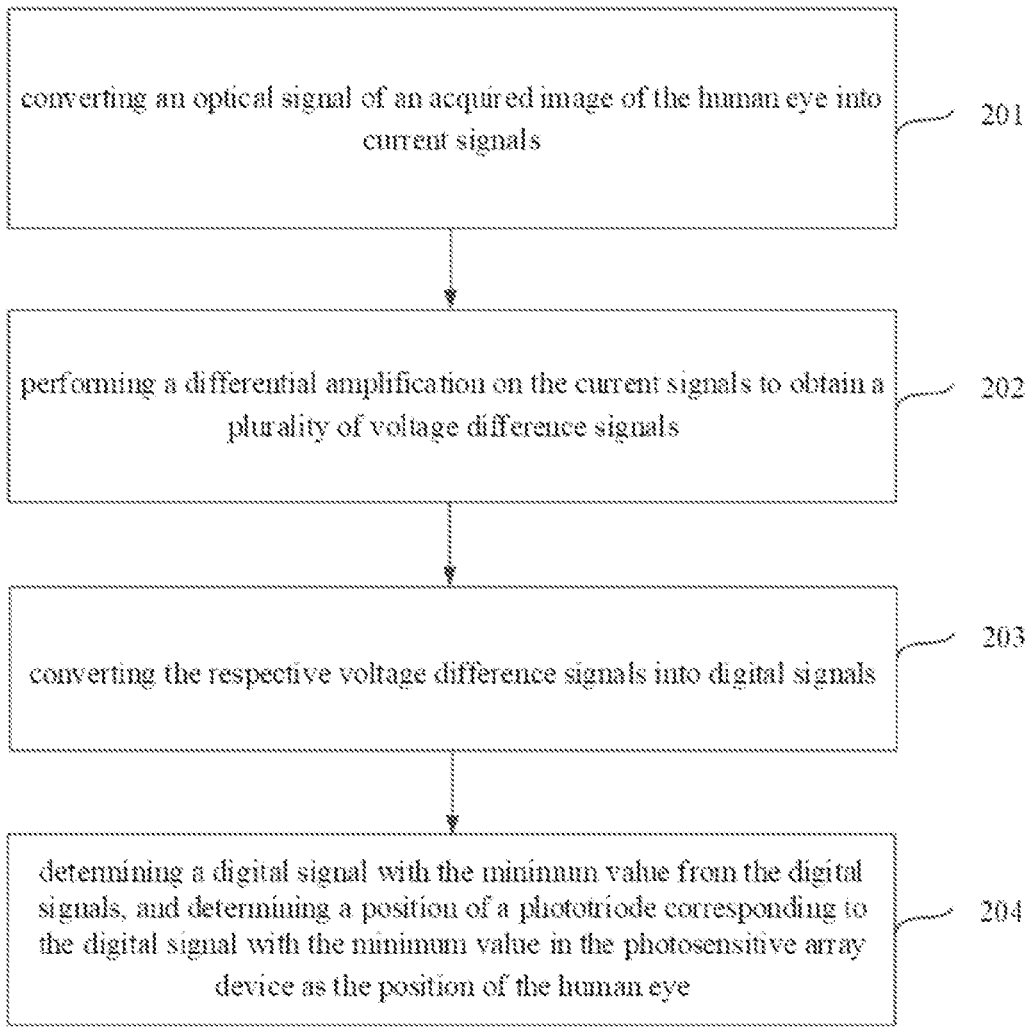

converting an optical signal of an acquired image of the human eye into current signals — 201 performing a differential amplification on the current signals to obtain a plurality of voltage difference signals — 202 converting the respective voltage difference signals into digital signals — 203 determining a digital signal with the minimum value from the digital signals, and determining a position of a phototriode corresponding to the digital signal with the minimum value in the photosensitive array device as the position of the human eye — 204

Fig. 17

PHOTOSENSITIVE SYSTEM, DISPLAY APPARATUS AND METHOD FOR DETERMINING POSITION OF HUMAN EYE

CROSS-REFERENCE TO RELATED APPLICATIONS

The present disclosure is a National Phase Application filed under 35 U.S.C.

371 as a national stage of PCT/CN2022/136326 filed on Dec. 2, 2022, the content of which is incorporated herein in their entirety by reference.

TECHNICAL FIELD

The present disclosure relates to the field of display technology, and particularly relates to a photosensitive system, a display apparatus and a method for determining a position of a human eye.

BACKGROUND

At present, eyeball tracking in a 3D display technology mainly includes shooting and imaging through an external camera module, transmitting image information to an image signal processor (ISP) for positioning the human eyes, calculating a coordinate of a gazing point according to the positions of the human eyes, and generating images corresponding to positions of left and right eyes through a graphic processing unit (GPU) to realize a 3D effect of a parallax between the left and right eyes.

However, the image sampled by the current camera module generally has high definition and a report rate of 60/120 Hz, since the report rate is low, the delay from the movement of human eyes to the image being updated is too large, and the 3D display is not smooth. Moreover, the camera module acquires image information including more redundant information, in addition, an extraction of the position of the eyeball and a calculation of the fixation point are required, resulting to a long delay time.

SUMMARY

An embodiment of the present disclosure provides a photosensitive system, a display apparatus and a method for determining a position of a human eye, which are used for ensuring the accuracy of the position of the human eye gazing at a 3D display image.

The specific technical solutions provided in the present disclosure are as follows.

In a first aspect, an embodiment of the present disclosure provides a photosensitive system for determining a position of a human eye, including photosensitive array devices arranged in an array, an amplification circuit, an analog-to-digital conversion circuit and a coordinate determining circuit, which are sequentially connected together, wherein each photosensitive array device comprises a plurality of phototriodes, and the respective phototriodes are configured to convert an optical signal of an acquired image of the human eye into current signals;

the amplification circuit is configured to perform a differential amplification on the current signals to obtain a plurality of voltage difference signals, wherein the amplification circuit is a single-sampling amplification circuit or a dual-sampling amplification circuit;

the analog-to-digital conversion circuit is configured to convert the voltage difference signals into digital signals; and the coordinate determining circuit is configured to determine a digital signal with the minimum value from the digital signals, and determine a position of the phototriode, corresponding to the digital signal with the minimum value, of the phototriode device as the position of the human eye.

In a second aspect, an embodiment of the present disclosure further provides a single-sampling amplification circuit, including: a first input module, a first reference module, a first differential comparison module and a first output module, the first input module and the first reference module being connected with input terminals of the first differential comparison module, and the first output module being connected with an output terminal of the first differential comparison module, wherein the first input module is configured to input current signals generated by a photosensitive array for a same frame of image into the first differential comparison module;

the first reference module is configured to input a reference voltage corresponding to the same frame of image into the first differential comparison module;

the first differential comparison module is configured to perform a differential amplification on each current signal and the reference voltage to obtain a differential output signal; and the first output module is configured to output the differential output signal.

In some implementations, the first input module comprises a first switch, a first capacitor, and a second switch connected in series:

the first switch is configured to connect, when being closed, the photosensitive array with the first input module;

the first capacitor configured to transmit the current signals passing through the first switch to the second switch; and the second switch is configured to input, when being closed, the current signals passing through the first capacitor into the first differential comparison module.

In some implementations, the first capacitor is further configured to perform a charging operation when the current signals pass therethrough.

In some implementations, the first input module further comprises a third switch connected to another electrode of the first capacitor; and the first capacitor is further configured to perform a charging operation based on each of the current signals passing therethrough under the control of timing sequences corresponding to the first switch and the third switch, respectively.

In some implementations, the timing sequence corresponding to the first switch is a first timing sequence and the timing sequence corresponding to the third switch is a second timing sequence, and a duty ratio of the first timing sequence is different from a duty ratio of the second timing sequence.

In some implementations, the first input module further comprises a fourth switch and a fifth switch connected in series, the fourth switch being connected to a first electrode of the first capacitor, and the fifth switch being connected to a second electrode of the first capacitor; and the first capacitor is further configured to perform a discharging operation based on each of the current signals passing therethrough under the control of timing sequences corresponding to the fourth switch and the fifth switch, respectively.

In some implementations, the timing sequences corresponding to the fourth switch and the fifth switch both are a third timing sequence, a duty ratio of the third timing sequence being different from a duty ratio of the first timing sequence, and the duty ratio of the third timing is different from a duty ratio of the second timing sequence.

In some implementations, the first reference module comprises a sixth switch and a second capacitor connected in series, a capacitance value of the second capacitor is equal to a capacitance value of the first capacitor:

the sixth switch is configured to input, when being closed, the reference voltage corresponding to the same frame of image to the second capacitor; and the second capacitor is configured to input the reference voltage into the first differential comparison module.

In some implementations, the sixth switch is configured to be closed under the control of a fourth timing sequence; and the second capacitor is configured to perform a charging operation under the control of the fourth timing sequence.

In some implementations, the first reference module further comprises a seventh switch connected to an electrode of the second capacitor away from the sixth switch;

the seventh switch is configured to be closed under the control of a second timing sequence; and the second capacitor is configured to perform a discharging operation under the control of the second timing sequence.

In some implementations, the first differential comparison module comprises a first comparator, a third capacitor and a fourth capacitor connected between input terminals and output terminals of the first comparator, and a driving voltage input terminal, the third capacitor and the fourth capacitor having the same capacitance value:

the third capacitor and/or the fourth capacitor are configured to determine an amplification factor based on the first capacitor and/or the second capacitor;

the first comparator is configured to receive the current signals and the reference voltage and determine the differential output signal based on each current signal, the reference voltage, and the amplification factor; and the driving voltage input terminal is configured to input a driving voltage for the first comparator to start a comparison.

In some implementations, a connection switch is connected between an electrode of the first capacitor and an electrode of the second capacitor.

In some implementations, the reference voltage is inversely related to each current signal.

In some implementations, the single-sampling amplification circuit further includes: a first MOS transistor and a second MOS transistor connected to the first capacitor, wherein the first MOS transistor and the second MOS transistor are configured to enhance the driving capability of the first capacitor In a third aspect, an embodiment of the present disclosure further provides a dual-sampling amplification circuit, including: a second input module, a second driving module, a second differential comparison module, and a second output module, wherein the second input module and the second driving module are both connected with input terminals of the second differential comparison module, and the second output module is connected to an output terminal of the second differential comparison module:

the second input module is configured to input a difference value between two current signals, for two consecutive frames of image, respectively generated by a same phototriode in the photosensitive array into the second differential comparison module;

the second driving module is configured to input a second driving voltage into the second differential comparison module to start the second differential comparison module;

the second differential comparison module is configured to perform a differential amplification on the difference value between the two current signals and the second driving voltage, to obtain a second differential output signal; and the second output module is configured to output a second differential output signal.

In some implementations, the second input module comprises a first switch tube and a capacitor connected in series:

the first switch tube is configured to be closed under the control of an exposure timing sequence; and the capacitor is configured to calculate a difference between the two current signals, for the two consecutive frames of image, respectively generated by the same phototriode of the photosensitive array, to obtain the difference value.

In some implementations, the first switch tube is further configured to provide different exposure timing sequences for the current signals, for the two consecutive frames of image, corresponding to the respective phototriodes, respectively, such that under the control of the different exposure timing sequences, intensities of the current signals obtained for the respective frames of image are the same.

In some implementations, the second differential comparison module comprises a second comparator, and a fifth capacitor and a sixth capacitor connected between input terminals and output terminals of the second comparator:

the fifth capacitance and/or the sixth capacitance is configured to determine an amplification factor based on the capacitor; and the second comparator is configured to receive the difference value between the two current signals and determine the second differential output signal based on the difference value and the amplification factor.

In some implementations, the dual-sampling amplification circuit further includes a third MOS transistor and a fourth MOS transistor connected to the capacitor, where the third MOS transistor and the fourth MOS transistor are configured to enhance the driving capability of the capacitor.

In some implementations, the dual-sampling amplification circuit further includes: an eighth switch connected between a first electrode and a second electrode of the capacitor, where the eighth switch is configured to ensure, when being closed, stable operation of the capacitor.

In a fourth aspect, an embodiment of the present disclosure further provides a display apparatus for determining a position of a human eye, including: a display panel, the above-mentioned light sensing system, the single-sampling amplification circuit, and the dual-sampling amplification circuit.

In a fifth aspect, an embodiment of the present disclosure further provides a method for determining a position of a human eye, including:

converting an optical signal of an acquired image of the human eye into current signals;

performing a differential amplification on the current signals to obtain a plurality of voltage difference signals;

converting the respective voltage difference signals into digital signals; and determining a digital signal with the minimum value from the digital signals, and determining a position of a phototriode corresponding to the digital signal with the minimum value in the photosensitive array device as the position of the human eye.

The beneficial effects of the present disclosure are as follows:

in summary, in the embodiments of the present disclosure, a photosensitive system, a display apparatus and a method for determining a position of human eye are provided, where the photosensitive system includes: photosensitive array devices arranged in an array, an amplification circuit, an analog-to-digital conversion circuit and a coordinate determining circuit, which are sequentially connected together. Each photosensitive array device includes a plurality of phototriodes, the respective phototriodes are configured to convert the acquired optical signals of an image of human eye into current signals, the amplification circuit is configured to perform differential amplification on the respective current signals to obtain a plurality of voltage difference signals, the analog-to-digital conversion circuit is configured to convert the voltage difference signals into digital signals, the coordinate determining circuit is configured to determine the digital signal with the minimum value from the digital signals, and determine the position of the phototriode, corresponding to the digital signal with the minimum value, of the photosensitive array device as the position of human eye, so that the position of the human eye gazing at a 3D display image can be rapidly and accurately determined.

Additional features and advantages of the present disclosure will be set forth in the following description, and in part will be obvious from the description, or may be learned by the practice of the present disclosure. The objectives and other advantages of the present disclosure may be realized and attained by the structure particularly pointed out in the written description and claims hereof as well as the accompanying drawings.

BRIEF DESCRIPTION OF DRAWINGS

The accompanying drawings, which are included to provide a further understanding of the present disclosure and are incorporated in and constitute a part of the present disclosure, illustrate embodiment(s) of the present disclosure and together with the description serve to explain the present disclosure and not to limit the present disclosure. In the drawings:

FIG. 16 is a timing control diagram of a dual-sampling amplification circuit according to an embodiment of the present disclosure; and FIG. 17 is a flowchart illustrating a method for determining a position of a human eye according to an embodiment of the present disclosure.

DETAIL DESCRIPTION OF EMBODIMENTS

In order to make the objects, technical solutions and advantages of the embodiments of the present disclosure clearer, the technical solutions of the present disclosure will be clearly and completely described below with reference to the drawings in the embodiments of the present disclosure, and it is obvious that the described embodiments are some, but not all, embodiments of the technical solutions of the present disclosure. All other embodiments obtained by those skilled in the art based on the embodiments described in the present disclosure without any creative effort belong to the protection scope of the technical solution of the present disclosure.

The terms "first," "second," and the like in the description and claims of the present disclosure and in the above-mentioned drawings are used for distinguishing similar elements and not necessarily for describing a particular sequence or order. It is to be understood that the data used in such way may be interchangeable under appropriate circumstances such that the embodiments of the present disclosure described herein may be implemented in a sequence other than those illustrated or described herein.

Preferred embodiments of the present disclosure will be described in detail below with reference to the accompanying drawings.

Figure 1:
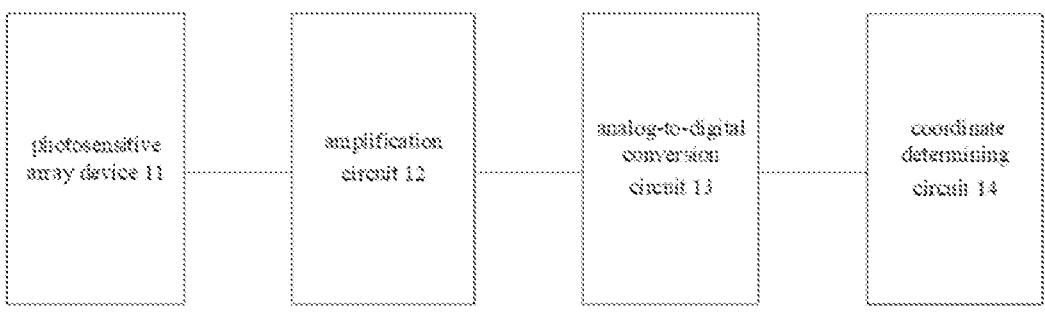
FIG. 1 is a schematic diagram of a system architecture of a photosensitive system for determining a position of a human eye according to an embodiment of the present disclosure.

Referring to FIG. 1, in an embodiment of the present disclosure, a photosensitive system for determining a position of a human eye includes: a photosensitive array devices 11 arranged in an array, an amplification circuit 12, an analog-to-digital conversion circuit 13 and a coordinate determining circuit 14, which are sequentially connected together.

The photosensitive array device includes a plurality of phototriodes (photosensitive transistors), and each phototriode is configured to convert an optical signal of an acquired image of the human eye into a current signal.

First, it should be noted that the phototriodes included in the above-mentioned photosensitive array device are NPN type phototiodes (also called as photosensitive NPN), and usually, each photosensitive array device includes hundreds of phototriodes, and in an implementation process, for a same frame of image of a human eye, each phototriode can convert the acquired optical signal corresponding to the image of the human eye into a current signal, and the current signals acquired by all the phototriodes in the photosensitive array device are gathered as a current signal corresponding to the image of the human eye.

The amplification circuit is configured to differentially amplify the current signals to obtain a plurality of voltage difference signals.

In an implementation process, after the current signals are obtained, for the convenience of subsequent processing and display, the amplification circuit performs a differential amplification on the obtained current signals to obtain the plurality of voltage difference signals.

It should be noted that, based on the difference of the signals serving as the comparison reference in the differential amplification comparison process, in the embodiment of the present disclosure, there are two differential amplification methods, one of which adopts a single-sampling amplification circuit and the other of which adopts a dual-sampling amplification circuit, where a signal serving as a comparison reference in the single-sampling amplification circuit is a reference voltage corresponding to a current frame of image, and a signal serving as a comparison reference in the dual-sampling amplification circuit is a current signal corresponding to a previous frame of image of the same phototriode.

The following description will first describe a case where the amplification circuit is a single-sampling amplification circuit.

Figure 2:
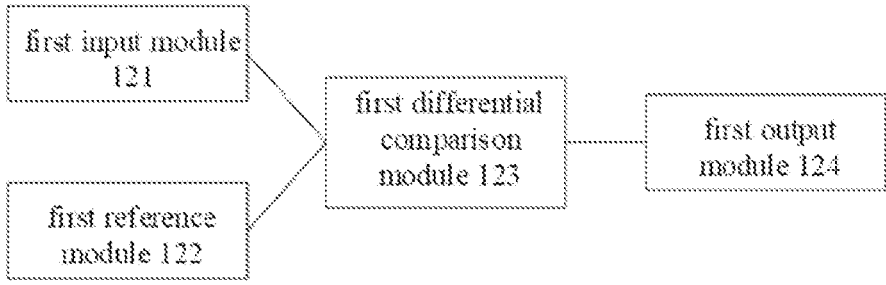
FIG. 2 is a schematic diagram illustrating a connection of a single-sampling amplification circuit according to an embodiment of the present disclosure.

Referring to FIG. 2, a single sampling amplification circuit includes: a first input module 121, a first reference module 122, a first differential comparison module 123 and a first output module 124, where the first input module and the first reference module are both connected to input terminals of the first differential comparison module, and the first output module is connected to an output terminal of the first differential comparison module.

In an implementation process, the first input module inputs the current signals generated by the photosensitive array (i.e., the photosensitive array devices) for a same frame of image into the first differential comparison module. The first reference module inputs a reference voltage corresponding to the same frame image into the first differential comparison module. The first differential comparison module performs differential amplification on the current signals and the reference voltage to obtain a differential output signal. The first output module is configured to output the differential output signal.

Figure 3:
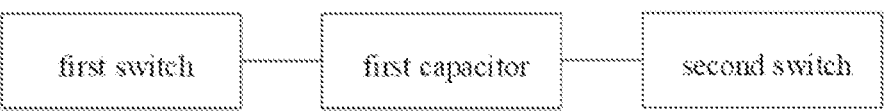
FIG. 3 is a schematic diagram illustrating a first input module according to an embodiment of the present disclosure.

Specifically, referring to FIG. 3, the first input module includes a first switch, a first capacitor and a second switch connected in series. In a case where the first switch is closed (turned on), the first switch electrically connects the photosensitive array with the first input module. The first capacitor transmits each current signal passing through the first switch to the second switch. In a case where the second switch is closed, the second switch inputs each current signal passing through the first capacitor into the first differential comparison module.

Figure 9:
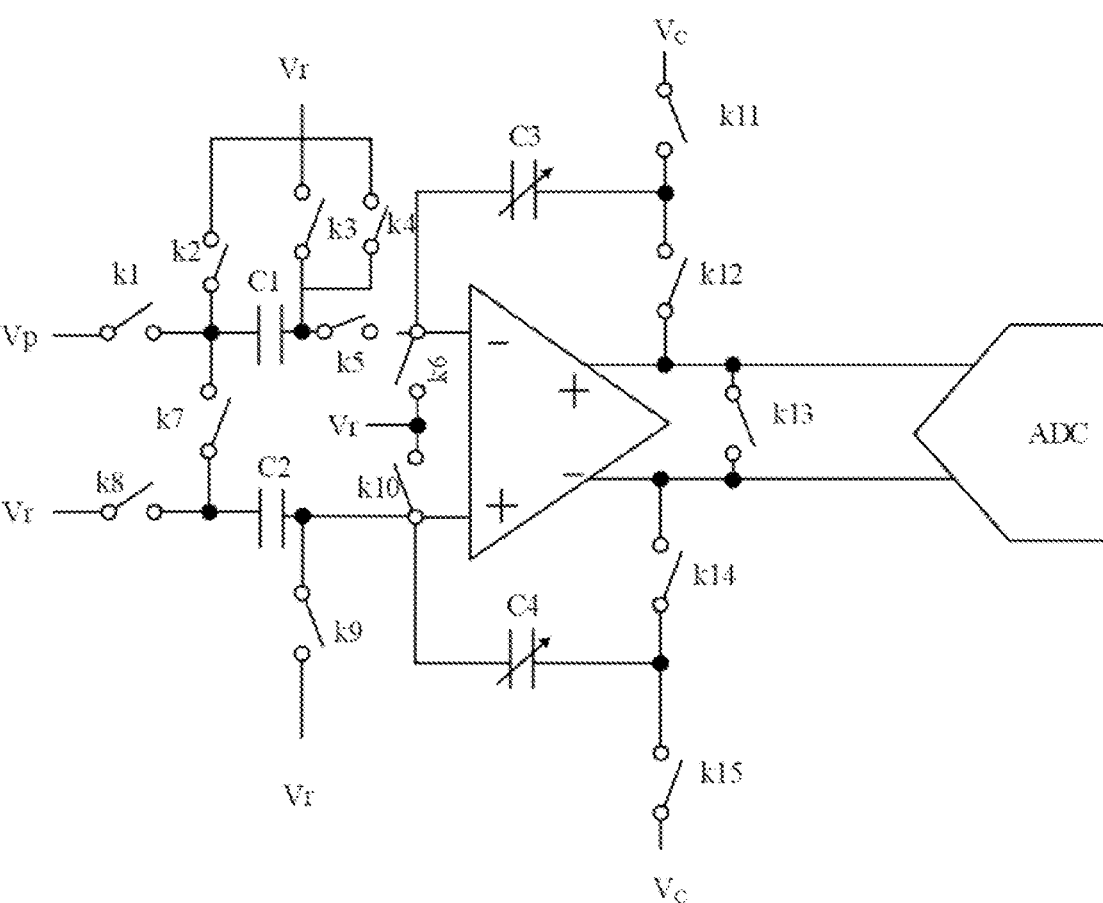
FIG. 9 is a schematic diagram illustrating a circuit connection of a single-sampling amplification circuit according to an embodiment of the present disclosure.

Referring to FIG. 9, the first input module includes a first switch k1, a first capacitor C1, and a second switch k5, in a case where the first switch k1 is closed, the first switch electrically connects the photosensitive array with the first input module. The first capacitor C1 transmits each current signal flowing through the first switch k1 to the second switch k5. In a case where the second switch k5 is closed, the second switch k5 inputs each current signal passing through the first capacitor C1 into the first differential comparison module.

Specifically, the first capacitor can further perform a charging operation when each current signal passes therethrough.

The first capacitor C1 performs a charging operation when each current signal passes therethrough.

Figure 4:
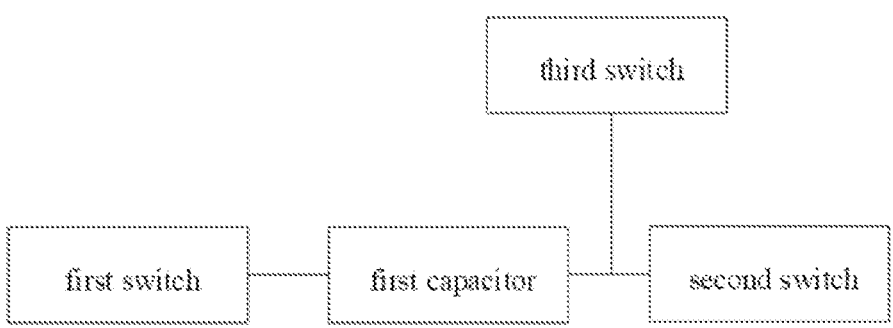
FIG. 4 is a schematic diagram illustrating a first input module according to an embodiment of the present disclosure.

Specifically, referring to FIGS. 4 and 9, the first input module further includes a third switch connected to another electrode of the first capacitor. In an implementation process, the first capacitor performs a charging operation based on each current signal passing therethrough under the control of timing sequences corresponding to the first switch and the third switch respectively.

In some implementations, the first capacitor C1 performs the charging operation by each current signal under the control of the timing sequence 2 (a timing sequence corresponding to the first switch k1) and the timing sequence 3 (a timing sequence corresponding to the third switch k3).

Specifically, the timing sequence corresponding to the first switch is a first timing sequence, and the timing sequence corresponding to the third switch is a second timing sequence, where duty ratios of the first timing sequence and the second timing sequence are different, and in some implementations, the duty ratio of the first timing sequence is greater than the duty ratio of the second timing sequence.

Figure 5:
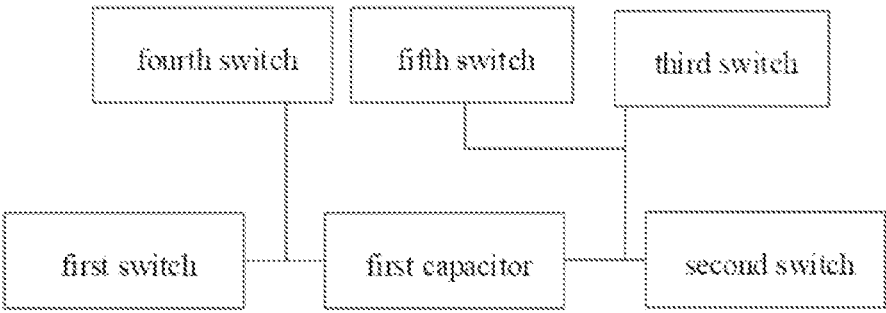
FIG. 5 is a schematic diagram illustrating a first input module according to an embodiment of the present disclosure.

Specifically, referring to FIG. 5, the first input module further includes a fourth switch and a fifth switch connected in series, where the fourth switch is connected to one electrode of the first capacitor, and the fifth switch is connected to the other electrode of the first capacitor. In an implementation process, the first capacitor performs a discharge operation based on each current signal passing therethrough under the control of timing sequences corresponding to the fourth switch and the fifth switch respectively.

In an implementation, the first capacitor C1 performs the discharging operation based on each current signal passing therethrough under the control of timing sequences corresponding to the fourth switch k2 and the fifth switch k4, that is, the accumulated charges in the first capacitor are eliminated by discharging, so that each current signal corresponding to the current frame of image is reset.

Specifically, the timing sequences corresponding to the fourth switch k2 and the fifth switch k4 are both a third timing sequence, i.e., a timing sequence 1, where the duty ratio of the third timing sequence is different from the duty ratio of the first timing sequence, and a duty ratio of the third timing sequence is different from the duty ratio of the second timing sequence, in some implementations, the duty ratio of the third timing sequence is greater than the duty ratio of the first timing sequence, and the duty ratio of the third timing sequence is further greater than the duty ratio of the second timing sequence.

Figure 6:
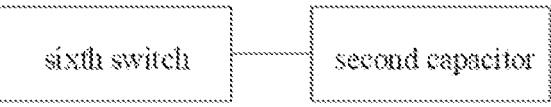
FIG. 6 is a schematic diagram of a first reference module according to an embodiment of the present disclosure.

Specifically, referring to FIG. 6, the first reference module includes a sixth switch k8 and a second capacitor C2 connected in series, where a capacitance of the second capacitor C2 is equal to a capacitance of the first capacitor. In a case where the sixth switch k8 is closed, the sixth switch k8 inputs the reference voltage corresponding to the same frame of image to the second capacitor C2. The second capacitor C2 inputs the reference voltage into the first differential comparison module.

Specifically, the sixth switch k8 is closed under the control of a fourth timing sequence, that is, a timing sequence 4. The second capacitor performs a charging operation under the control of the fourth timing sequence.

Figure 7:
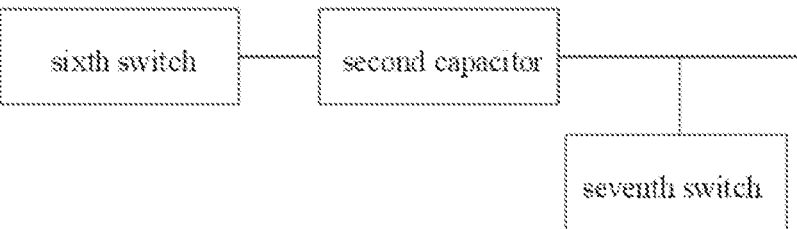
FIG. 7 is a schematic diagram of a first reference module according to an embodiment of the present disclosure.

Specifically, referring to FIGS. 7 and 9, the first reference module further includes a seventh switch k9, and the seventh switch k9 is connected to an electrode of the second capacitor C2 from the sixth switch k8. The seventh switch k9 is closed under the control of the second timing sequence, i.e., the timing sequence 3. The second capacitor C2 performs a discharging operation under the control of the second timing sequence.

Figure 8:
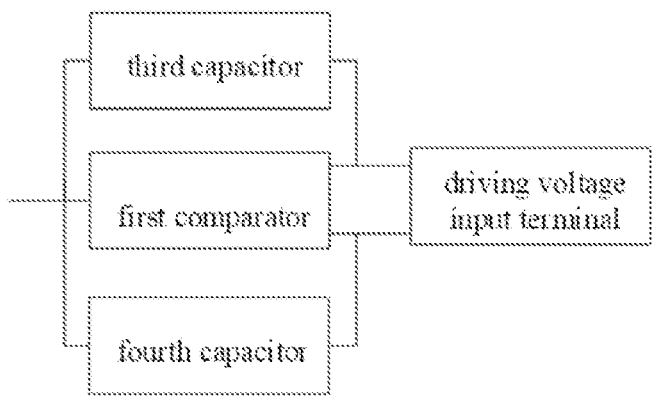
FIG. 8 is a schematic diagram of a first differential comparison module according to an embodiment of the present disclosure.

Specifically, as shown in FIG. 8, the first differential comparison module includes a first comparator, a third capacitor C3 and a fourth capacitor C4 connected between an input terminal and an output terminal of the first comparator, and a driving voltage input terminal, where capacitances of the third capacitor C3 and the fourth capacitor C4 are the same. An amplification factor may be determined by the third capacitor C3 and/or the fourth capacitor C4 based on the first capacitor C1 and/or the second capacitor C2, which may be denoted as C1/C3 or C2/C4. The first comparator receives each current signal Vp and the reference voltage Vr, and determines the differential output signal based on each current signal, the reference voltage, and the amplification factor. The driving voltage input terminal inputs a driving voltage Vc the first comparator to start comparison.

Figure 10:
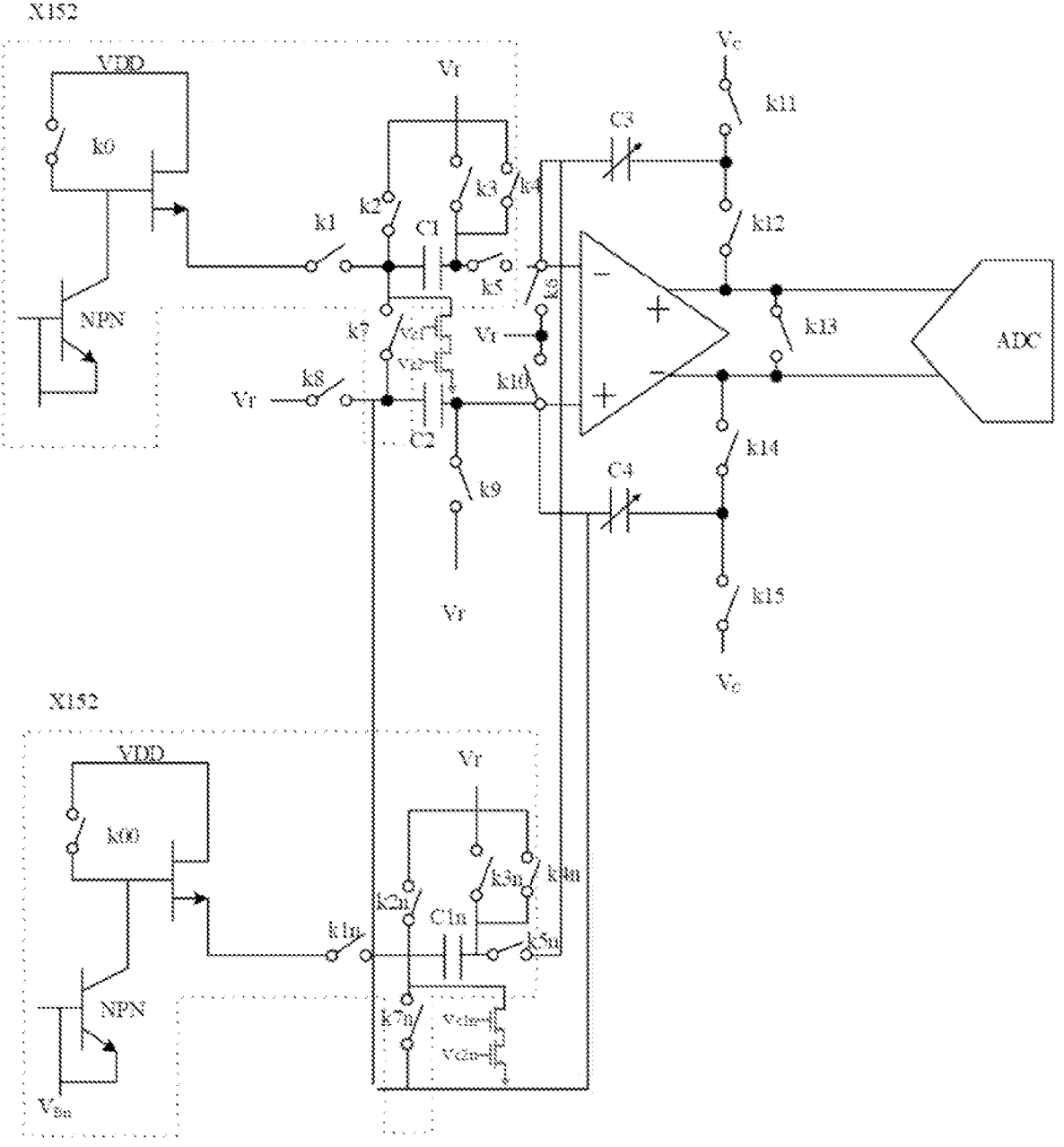
FIG. 10 is a schematic diagram illustrating a circuit connection of a single-sampling amplification circuit according to an embodiment of the present disclosure.
Figure 11:
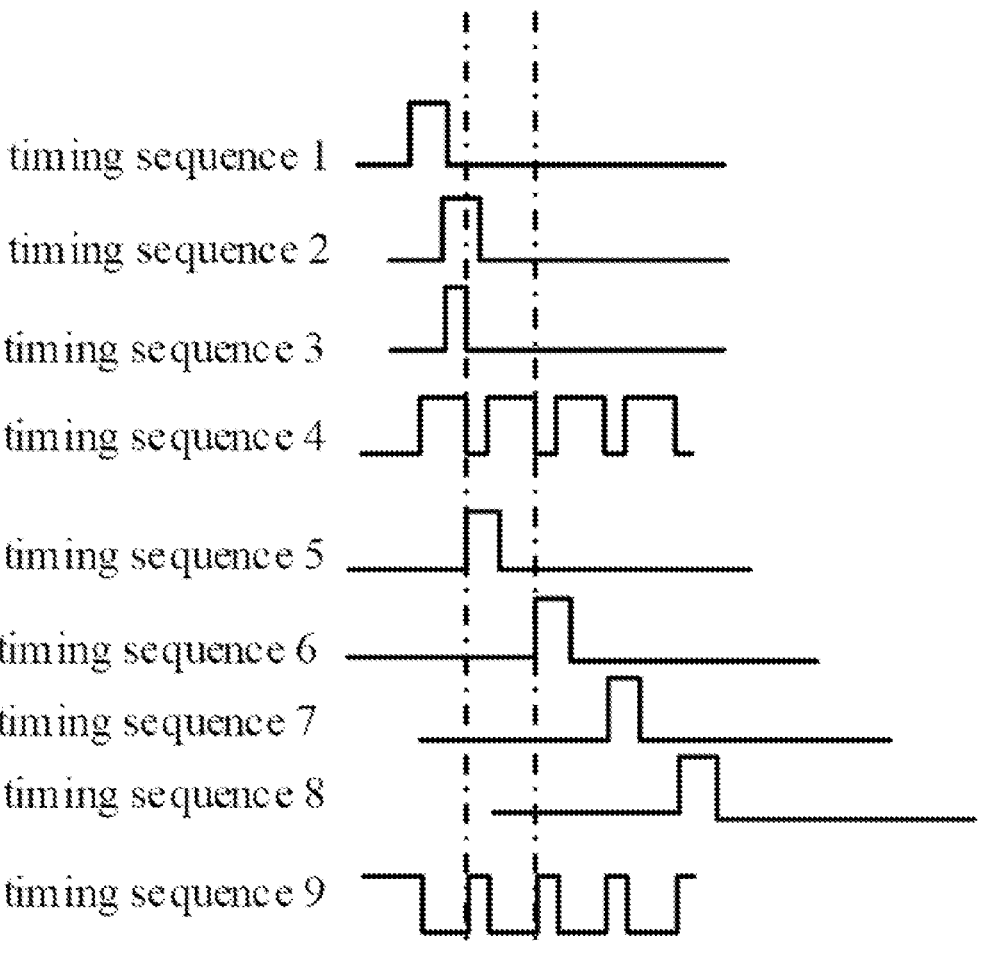
FIG. 11 is a timing control diagram of a single-sampling amplification circuit according to an embodiment of the present disclosure.

It should be noted that, referring to FIG. 10, in general, the photosensitive array device includes a plurality of (for example, 152) phototriodes arranged in an array, in some implementations, the plurality of phototriodes are all connected with a negative input terminal (an inverting input terminal) of the first comparator, that is, a first cascade unit is composed of a photosensitive NPN, a switch k0, the switch k1, the switch k2, a switch k3, the switch k4, the switch k5, and the first capacitor C1, and similarly, an $n^{th}$ cascade unit is composed of another photosensitive NPN, a switch k0$n$, a switch k1$n$, a switch k2$n$, a switch k3$n$, a switch k4$n$, a switch k5$n$, and a first capacitor C1$n$, and the cascade units respectively inputs the current signal Vp generated by the photosensitive NPN to the negative input terminal of the first comparator.

In some implementations, when switches k11, k12, k14 and k15 are closed, the driving voltage Vc for the first comparator is input to the first comparator. When being closed, the switch k13 connects the first comparator with the subsequent analog-to-digital conversion circuit 13. Further, when being closed, a switch k6 may input the reference voltage Vr into the third capacitor C3 and the fourth capacitor C4.

In order to enhance the driving capability of the first capacitor C1, the single-sampling amplification circuit further includes a first MOS transistor and a second MOS transistor connected with the first capacitor.

The first MOS transistor Vc1 and the second MOS transistor Vc2 are used for enhancing the driving capability of the capacitor C1, that is, the first MOS transistor and the second MOS transistor are in a normally turned-on state during the double-sampling circuit operating under the control of a first MOS driving voltage Vc1 and a second MOS driving voltage Vc2, respectively, so as to enhance the driving capability of the first capacitor C1.

Similarly, the $n^{th}$ cascade unit further includes a corresponding first MOS transistor Vc1$n$ and a corresponding second MOS transistor Vc2$n$ for enhancing the driving capability of the capacitor C1$n$, which are not described herein again.

In addition, a connection switch k7 is connected between one of the electrodes of the first capacitor C1 and one of the electrodes of the second capacitor C2, and when the connection switch k7 is closed, each current signal is transmitted to the fourth capacitor C4 at a positive input terminal (non-inverting input terminal) of the first comparator, so that the amplification circuit operates normally.

It should be noted that the reference voltage is inversely related to the current signal, that is, the reference voltage is inversely related to each current signal described above. In different frames of image, the reference voltage received by the single-sampling amplification circuit is inversely related to the current signal received by the single-sampling amplification circuit.

Figure 12:
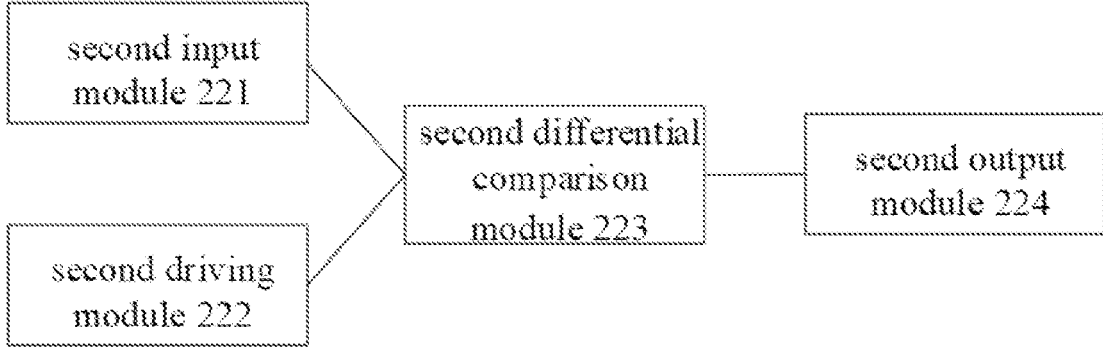
FIG. 12 is a schematic diagram illustrating a connection of a dual-sampling amplification circuit according to an embodiment of the present disclosure.

Referring to FIG. 12, the dual-sampling amplification circuit includes: a second input module 221, a second driving module 222, a second differential comparison module 223, and a second output module 224, where the second input module and the second driving module are both connected to input terminals of the second differential comparison module, and the second output module is connected to an output terminal of the second differential comparison module.

In an implementation process, the second input module inputs a difference value between two current signals respectively generated by two consecutive frames of image of a same phototriode in the photosensitive device into the second differential comparison module. The second driving module inputs a second driving voltage into the second differential comparison module to start the second differential comparison module. The second differential comparison module performs differential amplification on the difference value between the two current signals and the second driving voltage, to obtain a second differential output signal. The second output module is configured to output the second differential output signal.

Figure 13:
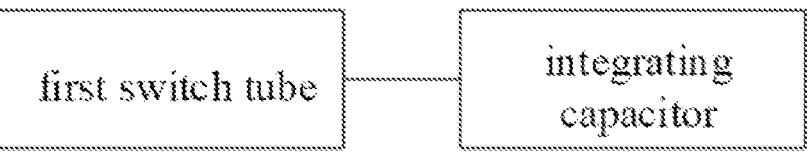
FIG. 13 is a schematic diagram illustrating a second input module according to an embodiment of the present disclosure.

Specifically, referring to FIG. 13, the second input module includes a first tube and a capacitor connected in series. The first switch transistor is closed under the control of an exposure timing sequence. The capacitor calculates a difference between two current signals respectively generated, for two consecutive frames of image, by the same phototriode in the photosensitive array, to obtain the difference value.

Figure 15:
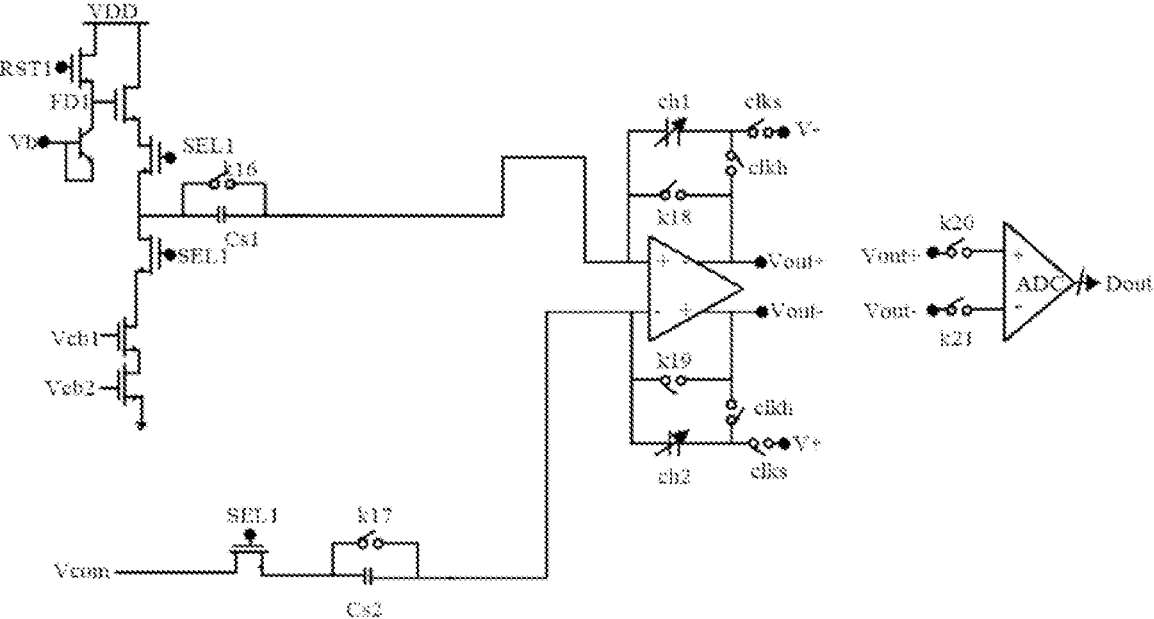
FIG. 15 is a schematic diagram of a dual-sampling amplification circuit according to an embodiment of the present disclosure.

Referring to FIG. 15, the second input module includes a first switch tube SEL1 and a capacitor Cs1 connected in series, and the first switch tube SEL1 is closed under the control of an exposure timing sequence RST1. The capacitor Cs1 is connected to a phototriode in the photosensitive array, as shown by FD1 in FIG. 16, the capacitor Cs1 can calculates a difference between two current signals respectively generated for two consecutive frames of image, that is, the capacitor Cs1 calculates a difference between a highest point and a lowest point of the current shown by FD1 in FIG. 16, so as to obtain the difference value.

Specifically, as shown in FIG. 16, the first switch tube provides different exposure timing sequences for the current signals corresponding to the phototriodes for two adjacent frames of image, so that the intensities of the obtained current signals are the same for the respective frames of image under the control of the different exposure timing sequences.

Since the first switch tube can process the current signals corresponding to the two adjacent frames of image of one phototriode, after the current signals corresponding to the two adjacent frames of image are processed, the current signals corresponding to the two adjacent frames of image of the next phototriode are continuously processed, and so on until the current signals corresponding to the two adjacent frames of image of all the phototriodes are processed. In consideration of different exposure conditions of the phototriodes for different frames of image, in an implementation process, for the frames of image, the intensities of the obtained current signals are the same under the control of different exposure timing sequences, so that the intensities of the obtained current signals are ensured to be the same.

Specifically, the second differential comparison module includes a second comparator, and a fifth capacitor and a sixth capacitor connected between input terminals and output terminals of the second comparator. An amplification factor may be determined by the fifth capacitor and/or the sixth capacitor based on a capacitor. The second comparator receives a difference value between the two current signals and determines the second differential output signal based on the difference value and the amplification factor.

Referring to FIG. 15, the second differential comparison module includes a second comparator, and a fifth capacitor ch1 and a sixth capacitor ch2 connected between the input terminals and the output terminals of the second comparator. The amplification factor may be determined by the fifth capacitor ch1 and/or the sixth capacitor ch2 based on the capacitor Cs1, which may be expressed as Cs1/ch1 or Cs2/ch2. The second comparator receives a difference value of the two current signals and determines the second differential output signal based on the difference value and the amplification factor.

Figure 14:
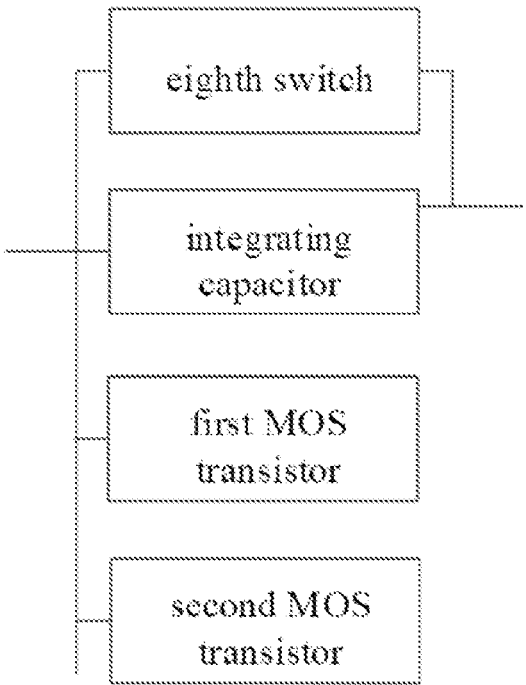
FIG. 14 is a schematic diagram illustrating a second input module according to an embodiment of the present disclosure.

Specifically, as shown in FIG. 14, the dual-sampling amplification circuit further includes a third MOS transistor and a fourth MOS transistor connected to the capacitor.

Referring to FIG. 15, the third MOS transistor Vcb1 and the fourth MOS transistor Vcb2 enhance the driving capability of the capacitor Cs1, that is, the third MOS transistor and the fourth MOS transistor are in a normally turned-on state during the dual-sampling circuit operating under the control of a third MOS driving voltage Vcb1 and a fourth MOS driving voltage Vcb2, respectively, so as to enhance the driving capability of the capacitor Cs1.

Specifically, referring to FIG. 15, an eighth switch is further connected between electrodes of the capacitor. When the eighth switch is closed, the stable operation of the capacitor is ensured.

An eighth switch k16 is further connected with the capacitor Cs1 in parallel. Since the capacitor Cs1 continuously accumulates charges therein, in order to ensure normal and stable operation of the capacitor Cs1, the eighth switch k16 is further provided, that is, when the eighth switch k16 is closed, the capacitor Cs1 is short-circuited, so as to eliminate charges in a part of the capacitor Cs1.

Based on the same inventive concept, an embodiment of the present disclosure provides a display apparatus for determining a position of a human eye, which comprises a display panel and the photosensitive system described above.

Specifically, the above-mentioned photosensitive system processes the acquired image of human eye and finally determines the position of the human eye, and the display panel may display the determined the position of the human eye, so that a 3D effect of parallax between the left and right eyes can be realized.

In some implementations, the photosensitive array devices in the photosensitive system are disposed in a bezel area of the display panel.

In order to improve the viewing effect of people to the greatest extent, in the embodiment of the present disclosure, the photosensitive array devices in the photosensitive system are disposed in the bezel area of the display panel, so that the viewing experience of people will not be influenced while the photosensitive array devices perform the image processing function.

Based on the same inventive concept, referring to FIG. 17, an embodiment of the present disclosure provides a method for determining a position of a human eye, including steps 201 to 204.

At step 201, an optical signal of an acquired image of the human eye is converted into a current signal.

In an implementation process, after a frame of image of the human eye is acquired, the optical signal of the image of the human eye is further converted into current signals, namely, the optical signal of the image of the human eye is converted into the current signals through the phototriodes in the photosensitive array devices.

At step 202, a differential amplification is performed on the current signals to obtain a plurality of voltage difference signals.

After the current signals corresponding to the image of the human eye are obtained, the respective current signals are subjected to a differential amplification, and therefore a plurality of voltage difference signals are obtained. In the present embodiment, the differential amplification process may be implemented by a single-sampling amplification circuit or a dual-sampling amplification circuit.

At step 203, the respective voltage difference signals are converted into digital signals.

After the voltage difference signals are obtained, the voltage difference signals are correspondingly converted into the digital signals respectively.

At step 204, a digital signal with the minimum value is determined based on the digital signals, and the position of the phototriode of the photosensitive array device corresponding to the digital signal with the minimum value is determined as the position of the human eye.

Since the photosensitive array device includes a plurality of phototriodes, in an implementation process, after a plurality of digital signals for a frame of image of the human eye are obtained, the digital signal with the minimum value is selected from the plurality of digital signals, the position of the phototriode, corresponding to the digital signal with the minimum value, of the photosensitive array device is determined as the position of the human eye, and the determined position of the human eye is the position of the human eye gazing at the display panel.

In summary, in the embodiments of the present disclosure, a photosensitive system, a display apparatus and a method for determining a position of a human eye are provided, where the photosensitive system includes: photosensitive array devices arranged in an array, an amplification circuit, an analog-to-digital conversion circuit and a coordinate determining circuit, which are sequentially connected together. Each photosensitive array device includes a plurality of phototriodes, the respective phototriodes are configured to convert the acquired optical signals of an image of human eye into current signals, the amplification circuit is configured to perform differential amplification on the respective current signals to obtain a plurality of voltage difference signals, the analog-to-digital conversion circuit is configured to convert the voltage difference signals into digital signals, the coordinate determining circuit is configured to determine the digital signal with the minimum value from the digital signals, and determine the position of the phototriode, corresponding to the digital signal with the minimum value, of the photosensitive array device as the position of the human eye, so that the position of the human eye gazing at a 3D display image can be rapidly and accurately determined.

As will be appreciated by those skilled in the art, the embodiments of the present disclosure may be provided as a method, a system, or a computer program product. Accordingly, the present disclosure may take the form of an embodiment of a complete hardware, an embodiment of a complete software or an embodiment combining software and hardware aspects. Furthermore, the present disclosure may take the form of a computer program product embodied on one or more computer-usable storage medium (including, but not limited to, disk storage, CD-ROM, optical storage, and the like) having computer-usable program code embodied therein.

The present disclosure is described with reference to flowcharts and/or block diagrams of the methods, the apparatus (systems), and the computer program product according to the present disclosure. It will be understood that each flow and/or block of the flowcharts and/or block diagrams, and combinations of flows and/or blocks in the flowcharts and/or block diagrams, can be implemented by computer program instructions. These computer program instructions may be provided to a processor of a general purpose computer, special purpose computer, embedded processor, or other programmable data processing apparatus to produce a machine, such that the instructions, which are executed by the processor of the computer or other programmable data processing apparatus, create means for implementing the functions specified in one or more flows in the flowchart and/or one or more blocks in the block diagram.

These computer program instructions may alternatively be stored in a computer-readable memory that can direct a computer or other programmable data processing apparatus to operate in a specific manner, such that the instructions stored in the computer-readable memory produce a product including an instruction mean which implement the function specified in one or more flows in the flowchart and/or one or more blocks in the block diagram.

These computer program instructions may alternatively be loaded onto a computer or other programmable data processing apparatus to cause a series of operation steps to be performed on the computer or other programmable apparatus to produce a computer implemented process such that the instructions which are executed on the computer or other programmable apparatus provide steps for implementing the functions specified in one or more flows in the flowchart and/or one or more blocks in the block diagram.

It will be apparent to those skilled in the art that various changes and modifications may be made in the present disclosure without departing from the spirit and scope of the present disclosure. Thus, if such changes and modifications of the present disclosure fall within the scope of the claims of the present disclosure and their equivalents, the present disclosure is intended to include such modifications and changes as well.

What is claimed is:

1. A photosensitive system for determining a position of a human eye, comprising: photosensitive array devices arranged in an array, an amplification circuit, an analog-to-digital conversion circuit and a coordinate determining circuit, which are sequentially connected together, wherein each photosensitive array device comprises a plurality of phototriodes, and the respective phototriodes are configured to convert an optical signal of an acquired image of the human eye into current signals;

the amplification circuit is configured to perform a differential amplification on the current signals to obtain a plurality of voltage difference signals, wherein the amplification circuit is a single-sampling amplification circuit or a dual-sampling amplification circuit;

the analog-to-digital conversion circuit is configured to convert the voltage difference signals into digital signals; and the coordinate determining circuit is configured to determine a digital signal with the minimum value from the digital signals, and determine a position of the phototriode, corresponding to the digital signal with the minimum value, of the phototriode device as the position of the human eye.

2. A single-sampling amplification circuit, comprising: a first input module, a first reference module, a first differential comparison module and a first output module, the first input module and the first reference module being connected with input terminals of the first differential comparison module, and the first output module being connected with an output terminal of the first differential comparison module, wherein the first input module is configured to input current signals generated by a photosensitive array for a same frame of image into the first differential comparison module;

the first reference module is configured to input a reference voltage corresponding to the same frame of image into the first differential comparison module;

the first differential comparison module is configured to perform a differential amplification on each current signal and the reference voltage to obtain a differential output signal; and the first output module is configured to output the differential output signal.

3. The single-sampling amplification circuit of claim 2, wherein the first input module comprises a first switch, a first capacitor, and a second switch connected in series;

the first switch is configured to connect, when being closed, the photosensitive array with the first input module;

the first capacitor configured to transmit the current signals passing through the first switch to the second switch, and perform a charging operation when the current signals pass therethrough; and the second switch is configured to input, when being closed, the current signals passing through the first capacitor into the first differential comparison module.

4. The single-sampling amplification circuit of claim 3, wherein the first input module further comprises a third switch connected to a second electrode of the first capacitor; and the first capacitor is further configured to perform a charging operation based on each of the current signals passing therethrough under the control of timing sequences corresponding to the first switch and the third switch, respectively.

5. The single-sampling amplification circuit of claim 4, wherein the timing sequence corresponding to the first switch is a first timing sequence and the timing sequence corresponding to the third switch is a second timing sequence, and a duty ratio of the first timing sequence is different from a duty ratio of the second timing sequence.

6. The single-sampling amplification circuit of claim 3, wherein the first input module further comprises a fourth switch and a fifth switch connected in series, the fourth switch being connected to a first electrode of the first capacitor, and the fifth switch being connected to a second electrode of the first capacitor; and the first capacitor is further configured to perform a discharging operation based on each of the current signals passing therethrough under the control of timing sequences corresponding to the fourth switch and the fifth switch, respectively.

7. The single-sampling amplification circuit of claim 3, wherein the timing sequences corresponding to the fourth switch and the fifth switch both are a third timing sequence, a duty ratio of the third timing sequence being different from a duty ratio of the first timing sequence, and the duty ratio of the third timing is different from a duty ratio of the second timing sequence.

8. The single-sampling amplification circuit of claim 2, wherein the first reference module comprises a sixth switch and a second capacitor connected in series, a capacitance value of the second capacitor is equal to a capacitance value of the first capacitor;

the sixth switch is configured to input, when being closed, the reference voltage corresponding to the same frame of image to the second capacitor; and the second capacitor is configured to input the reference voltage into the first differential comparison module.

9. The single-sampling amplification circuit of claim 8, wherein the sixth switch is configured to be closed under the control of a fourth timing sequence; and the second capacitor is configured to perform a charging operation under the control of the fourth timing sequence.

10. The single-sampling amplification circuit of claim 8, wherein the first reference module further comprises a seventh switch connected to an electrode of the second capacitor away from the sixth switch;

the seventh switch is configured to be closed under the control of a second timing sequence; and the second capacitor is configured to perform a discharging operation under the control of the second timing sequence.

11. The single-sampling amplification circuit of claim 2, wherein the first differential comparison module comprises a first comparator, a third capacitor and a fourth capacitor connected between input terminals and output terminals of the first comparator, and a driving voltage input terminal, the third capacitor and the fourth capacitor having the same capacitance value;

the third capacitor and/or the fourth capacitor are configured to determine an amplification factor based on the first capacitor and/or the second capacitor;

the first comparator is configured to receive the current signals and the reference voltage and determine the differential output signal based on each current signal, the reference voltage, and the amplification factor; and the driving voltage input terminal is configured to input a driving voltage for the first comparator to start a comparison.

12. The single-sampling amplification circuit of claim 2, wherein a connection switch is connected between an electrode of the first capacitor and an electrode of the second capacitor, and the reference voltage is inversely related to each current signal.

13. The single-sampling amplification circuit of claim 3, further comprising: a first MOS transistor and a second MOS transistor connected to the first capacitor, wherein the first MOS transistor and the second MOS transistor are configured to enhance the driving capability of the first capacitor.

14. A dual-sampling amplification circuit, comprising: a second input module, a second driving module, a second differential comparison module, and a second output module, wherein the second input module and the second driving module are both connected with input terminals of the second differential comparison module, and the second output module is connected to an output terminal of the second differential comparison module;

the second input module is configured to input a difference value between two current signals, for two consecutive frames of image, respectively generated by a same phototriode in the photosensitive array into the second differential comparison module;

the second driving module is configured to input a second driving voltage into the second differential comparison module to start the second differential comparison module;

the second differential comparison module is configured to perform a differential amplification on the difference value between the two current signals and the second driving voltage, to obtain a second differential output signal; and the second output module is configured to output a second differential output signal.

15. The dual-sampling amplification circuit of claim 14, wherein the second input module comprises a first switch tube and a capacitor connected in series;

the first switch tube is configured to be closed under the control of an exposure timing sequence; and the capacitor is configured to calculate a difference between the two current signals, for the two consecutive frames of image, respectively generated by the same phototriode of the photosensitive array, to obtain the difference value.

16. The dual-sampling amplification circuit of claim 15, wherein the first switch tube is further configured to provide different exposure timing sequences for the current signals, for the two consecutive frames of image, corresponding to the respective phototriodes, respectively, such that under the control of the different exposure timing sequences, intensities of the current signals obtained for the respective frames of image are the same.

17. The dual-sampling amplification circuit of claim 14, wherein the second differential comparison module comprises a second comparator, and a fifth capacitor and a sixth capacitor connected between input terminals and output terminals of the second comparator;

the fifth capacitance and/or the sixth capacitance is configured to determine an amplification factor based on the capacitor; and the second comparator is configured to receive the difference value between the two current signals and determine the second differential output signal based on the difference value and the amplification factor.

18. The dual-sampling amplification circuit of claim 15, further comprising: a third MOS transistor and a fourth MOS transistor connected to the capacitor, wherein the third MOS transistor and the fourth MOS transistor are configured to enhance the driving capability of the capacitor.

19. The dual-sampling amplification circuit of claim 14, further comprising: an eighth switch connected between a first electrode and a second electrode of the capacitor, wherein the eighth switch is configured to ensure, when being closed, stable operation of the capacitor.

20. A display apparatus for determining a position of a human eye, comprising: a display panel and the photosensitive system of claim 1, a single-sampling amplification circuit and a dual-sampling amplification circuit, wherein the single-sampling amplification circuit comprises: a first input module, a first reference module, a first differential comparison module and a first output module, the first input module and the first reference module being connected with input terminals of the first differential comparison module, and the first output module being connected with an output terminal of the first differential comparison module, the first input module is configured to input current signals generated by a photosensitive array for a same frame of image into the first differential comparison module;

the first reference module is configured to input a reference voltage corresponding to the same frame of image into the first differential comparison module;

the first differential comparison module is configured to perform a differential amplification on each current signal and the reference voltage to obtain a differential output signal; and the first output module is configured to output the differential output signal, and wherein the dual-sampling amplification circuit comprises: a second input module, a second driving module, a second differential comparison module, and a second output module, wherein the second input module and the second driving module are both connected with input terminals of the second differential comparison module, and the second output module is connected to an output terminal of the second differential comparison module;

the second input module is configured to input a difference value between two current signals, for two consecutive frames of image, respectively generated by a same phototriode in the photosensitive array into the second differential comparison module;

the second driving module is configured to input a second driving voltage into the second differential comparison module to start the second differential comparison module:

the second differential comparison module is configured to perform a differential amplification on the difference value between the two current signals and the second driving voltage, to obtain a second differential output signal; and the second output module is configured to output a second differential output signal.

* * * * *